United States Patent [19]

Takagi

[11] Patent Number: 5,157,675
[45] Date of Patent: Oct. 20, 1992

[54] APPARATUS UTILIZING LIGHT EMITTING SEMICONDUCTOR DEVICE

[75] Inventor: Takeshi Takagi, Ibaraki, Japan
[73] Assignee: Omron Corporation, Kyoto, Japan
[21] Appl. No.: 813,003
[22] Filed: Dec. 24, 1991

Related U.S. Application Data

[62] Division of Ser. No. 554,726, Jul. 19, 1990, Pat. No. 5,111,034.

[30] Foreign Application Priority Data

Sep. 27, 1989 [JP] Japan ............................... 1-249298
Sep. 27, 1989 [JP] Japan ............................... 1-249299
Sep. 27, 1989 [JP] Japan ............................... 1-249300

[51] Int. Cl.$^5$ ............................................ H01S 3/10
[52] U.S. Cl. ................................... 372/24; 372/38
[58] Field of Search .................... 372/24, 19, 25, 38

[56] References Cited

U.S. PATENT DOCUMENTS 4,733,398  3/1988  Shibagaki et al. .............. 372/38
4,763,334  8/1988  Shimada et al. ................ 372/24
4,813,046  3/1989  Shimada .......................... 372/24

OTHER PUBLICATIONS

T. Takagi et al., "Quantum Well Laser Diode With Non-Injection Region", 1989 Autum Dai 50 Kai Ouyou Butsuri Gakkai8 (JSAP) Gakujutsu Kouenaki Kouen Yokoushu, 28 p. ZL-14, Sep. 27-30, 1989.

Primary Examiner—John D. Lee
Assistant Examiner—Robert E. Wise
Attorney, Agent, or Firm—Dickstein, Shapiro & Morin

[57] ABSTRACT

Disclosed is an apparatus utilizing a light emitting semiconductor device which has a pumped region and an unpumped absorber region and in which an active layer has a quantum well structure. In this light emitting semiconductor device, driving current/light output characteristics have dependence on the pulse width of a driving current. A logic unit or a noise reducing apparatus is realized utilizing this property. Furthermore, in the above described light emitting semiconductor device, the central wavelength of emitted light has dependence on a driving current or dependence on driving time. A light beam scanner can be realized utilizing this property.

2 Claims, 15 Drawing Sheets

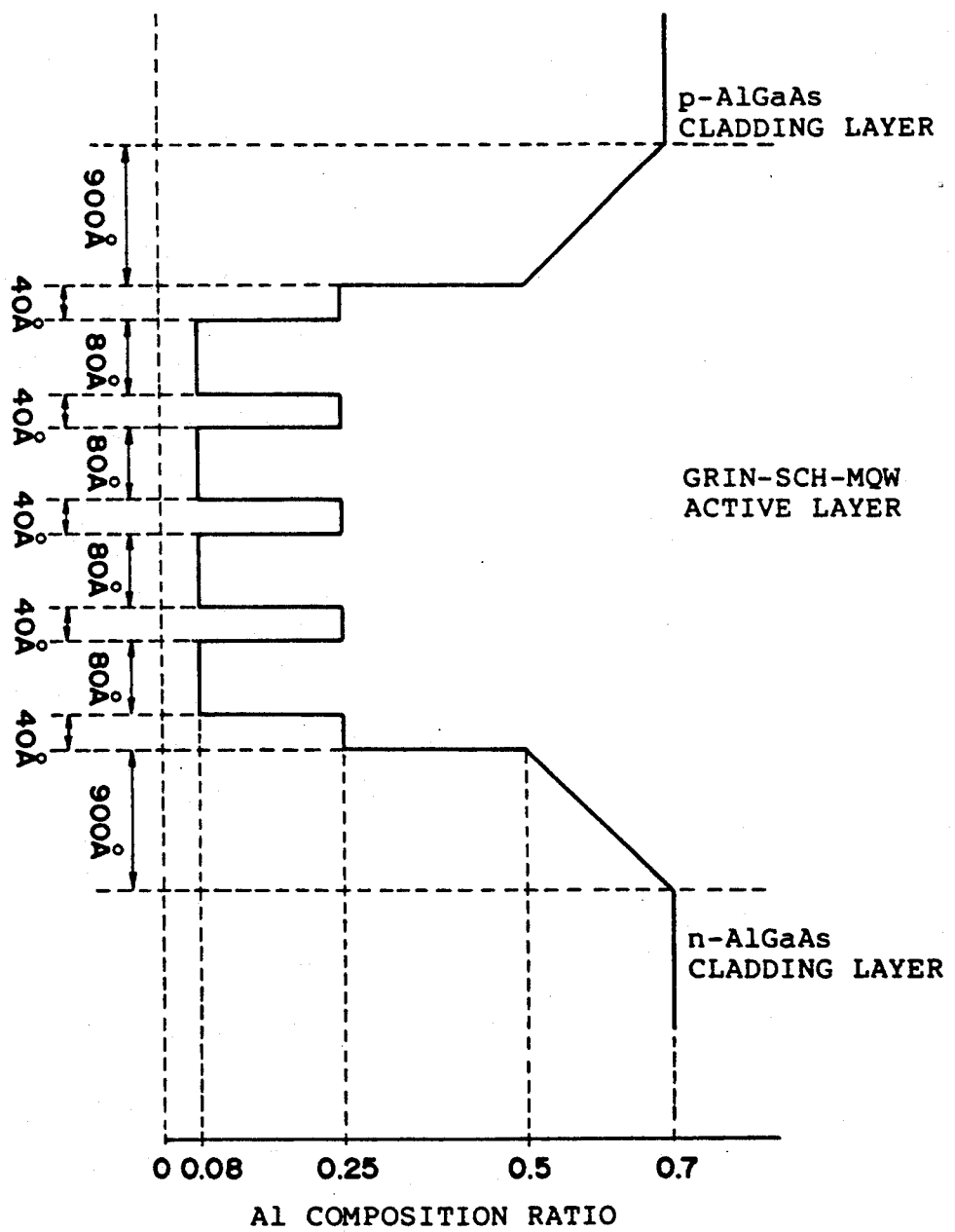

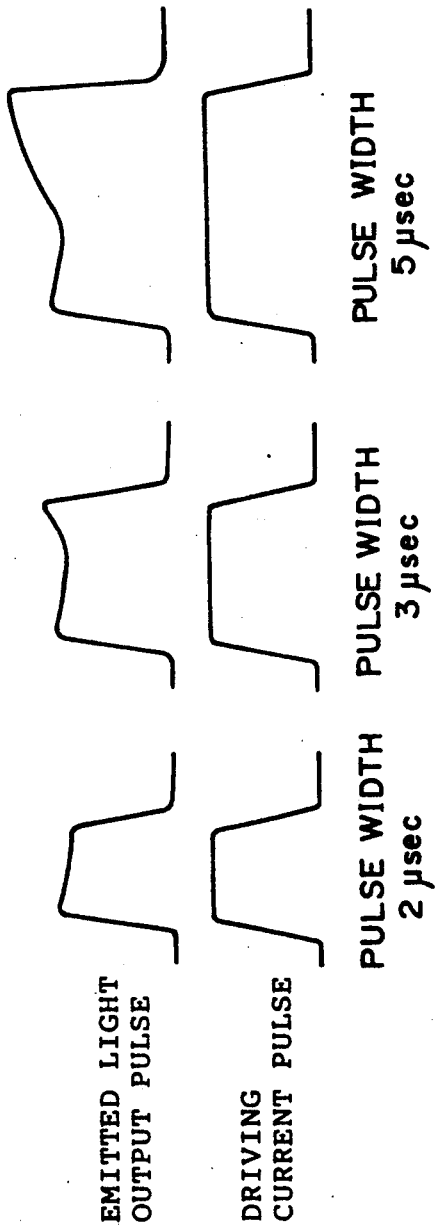

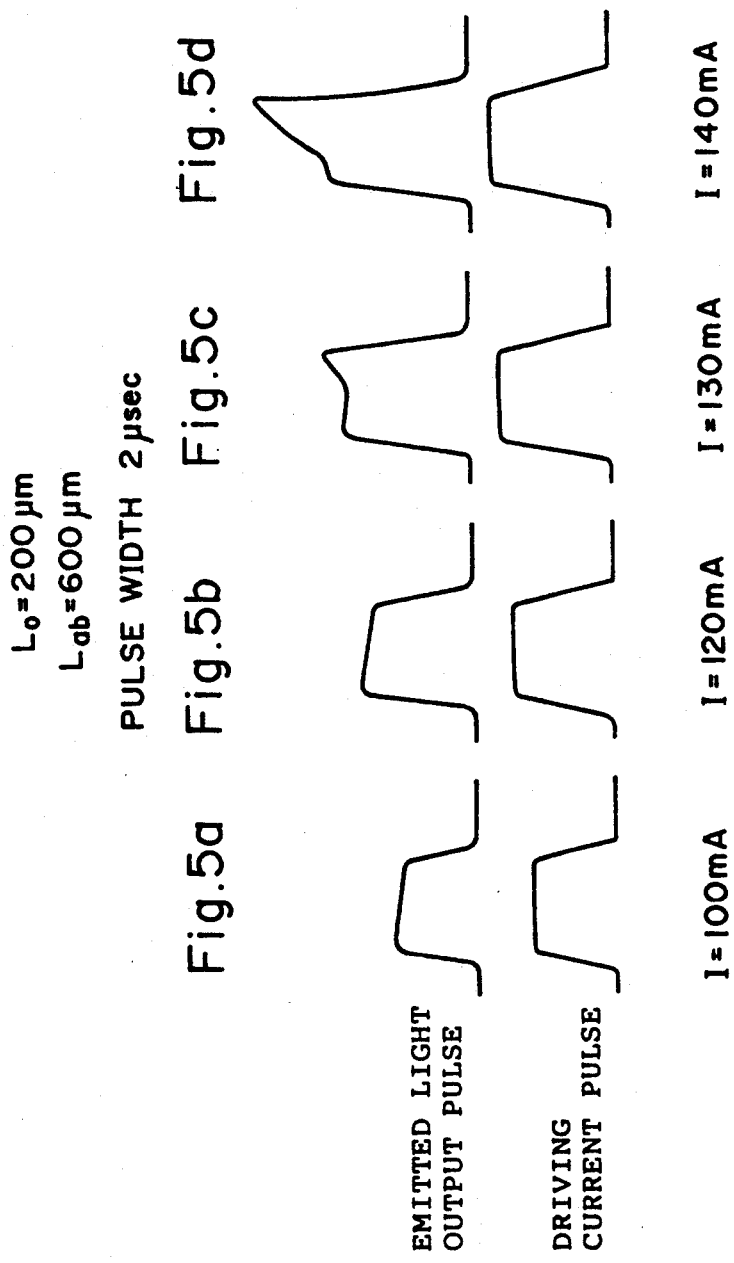

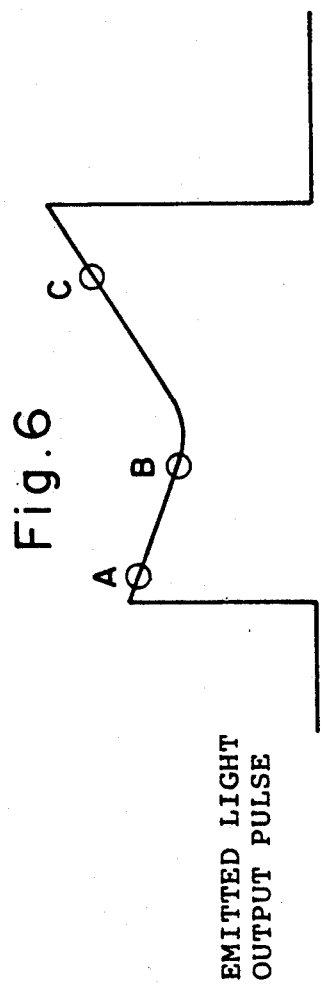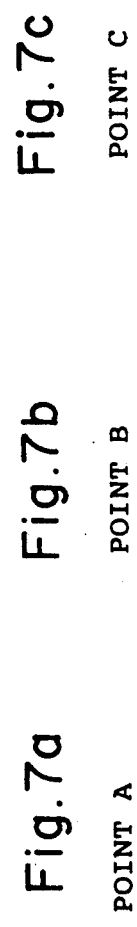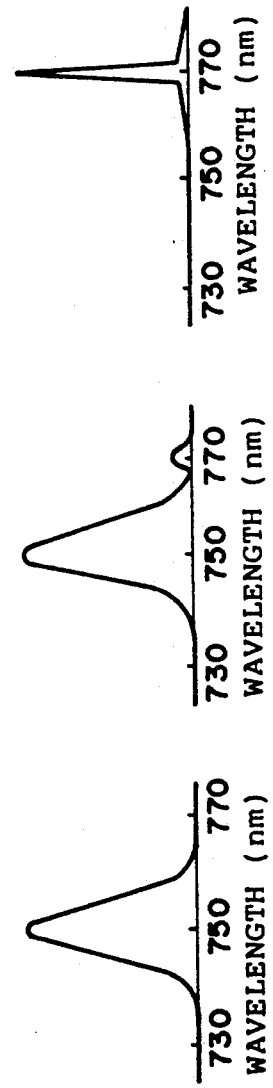

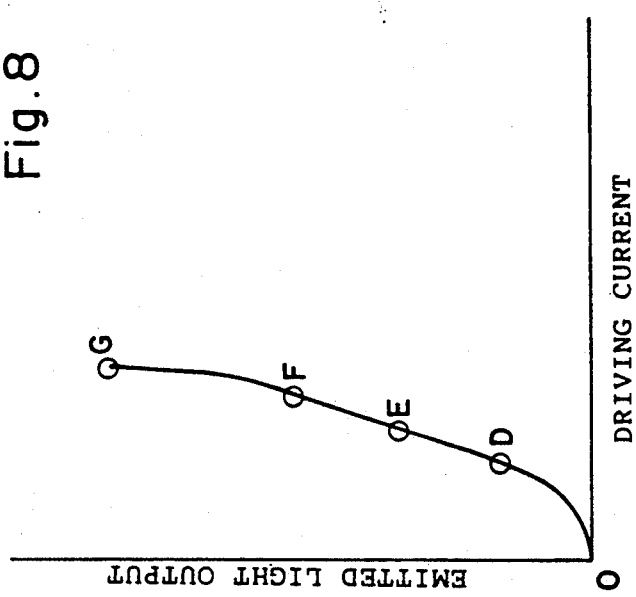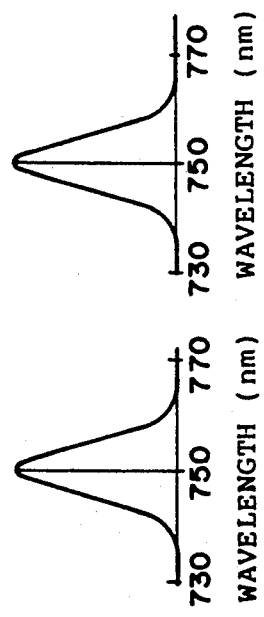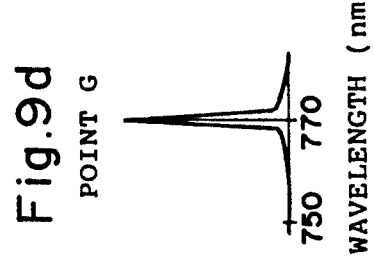

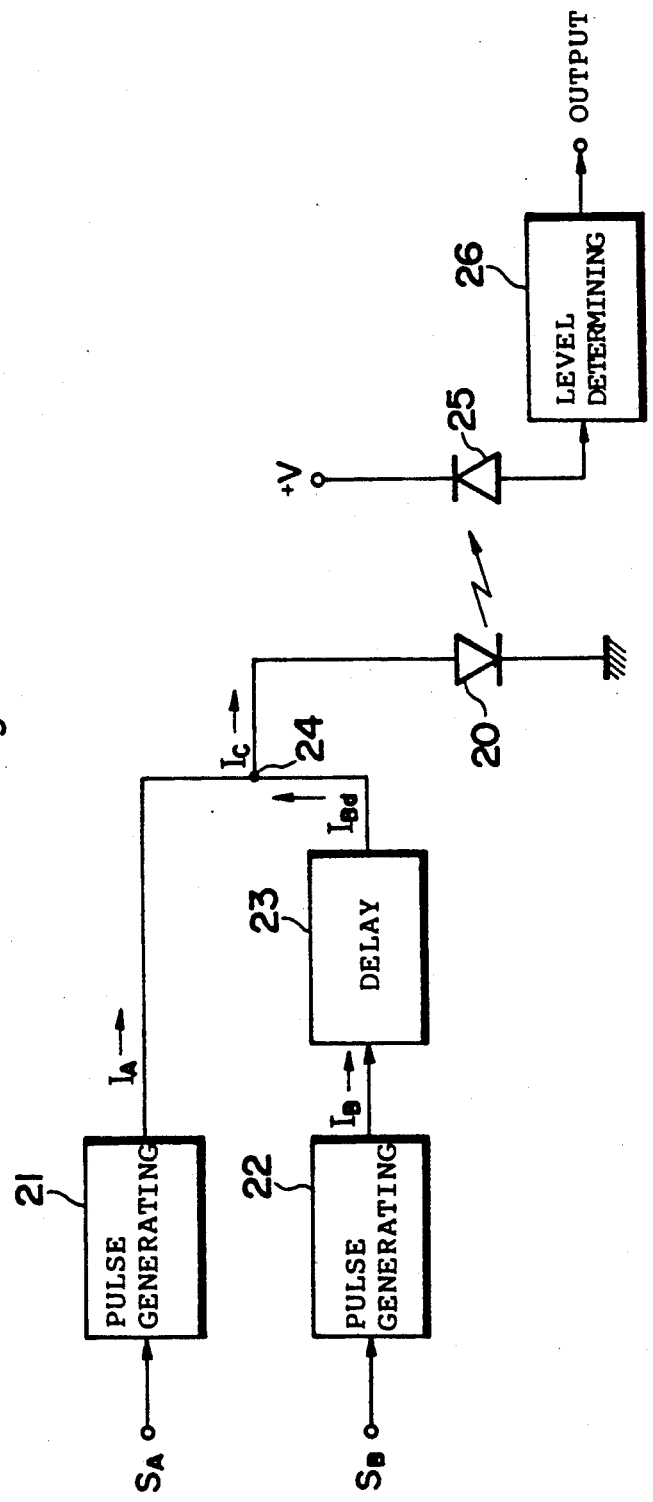

APPARATUS UTILIZING LIGHT EMITTING SEMICONDUCTOR DEVICE

This application is a division of application Ser. No. 07/554,726 filed Jul. 19, 1990, now U.S. Pat. No. 5,111,034.

BACKGROUND OF THE INVENTION

1. Field of the Invention

The present invention relates generally to apparatuses utilizing a light emitting semiconductor device, and more particularly, to a logic unit, a noise reducing or canceling apparatus and a light beam scanner.

2. Description of the Related Art

As conventional logic units, one of such a type that a semiconductor such as silicon (Si) is used and data is inputted or outputted in the form of an electric signal has been dominant. On the other hand, in recent years, an optical computer suitable for parallel processing has received attention. This optical computer, however, has not been of such construction as to process all data by an optical signal. Accordingly, a device for converting an electric signal into an optical signal is required. Presently, however, this electro-optical converter does not have additional functions other than an electro-optical converting function. Thus, the construction such as the electro-optical converter plus an optical logic unit or an electrical logic unit plus the electro-optical converter is required if some logic operation is actually exerted using light. Accordingly, the logic unit has the disadvantage of being complicate and large in size.

Description is now made of an apparatus for reducing or canceling a noise component included in a signal, for example, before or after data.

In many cases, a signal generated from a mechanical switching point includes a noise component based on chattering or the like. Conventional noise reducing circuits are of various types: one provided with a timer, one provided with a counter and the like. A noise reducing circuit provided with a timer is so constructed as to generate an output signal only if an input signal is ocntinued for a constant time period or more. A noise reducing circuit provided with a counter samples an input signal at constant intervals and performs electrical processing such that an output signal attains a high level if the sampled input signal is at a high level a predetermined number of times or more while attaining a low level if it is at a low level a predetermined number of times or more. However, an electric circuit for performing the above described electrical processing is required in such a conventional noise reducing apparatus. Accordingly, the noise reducing apparatus has the disadvantage of being large in size and complicated.

As apparatuses for scanning a light beam, one using a polygonal mirror as represented by a laser beam printer has been conventionally dominant. A beam scanning method using a polygonal mirror has the disadvantage of low response speed and low positional repeatability because there are mechanically moving parts.

SUMMARY OF THE INVENTION

An object of the present invention is to provide a logic unit which can execute an optical logic operation and whose construction can be made as simple as possible.

An object of the present invention is to provide a noise reducing or cancelling apparatus of simple construction.

An object of the present invention is to provide a light beam scanner having no mechanically moving parts.

The logic unit according to the present invention is characterized by comprising at least two input means for respectively converting at least two logical electric signals into output signals having a predetermined pulse width depending on logical values represented by the electric signals, delay means for delaying an output signal of one of the input means by time corresponding to the pulse width applied to an output signal of the other input means, a light emitimg semiconductor device which has a pumped region and an unpumped absorber region and in which an active layer has a quantum well structure and driving current/light output characteristics have dependence on the pulse width of a driving current, means for adding an output signal of the above delay means and the output signal of the above other input means to drive the above light emitting semiconductor device by the added output therefrom, a light receiving device for receiving light emitted from the above light emitting semiconductor device to generate a light reception signal at a level corresponding to the amount of the received light, and level determining means for discriminating the light reception signal outputted from the above light receiving device with a threshold level corresponding to the type of a logic operation.

According to the present invention, light which can be converted into a predetermined logical value is emitted by the above described light emitting semiconductor device. Accordingly, the construction of the logic unit is simplified. Moreover, a lot of logic operations such as an AND operation, an OR operation and an EXOR operation can be executed in response to the selection of a threshold level of the level determining means. In addition, a portion on the input side and a portion on the output side are coupled by light because there are provided the light emitting device and the light receiving device. The portions can be positionally separated. Furthermore, grounds on both sides need not be made common, thereby to improve flexibility.

The noise reducing apparatus according to the present invention is characterized by comprising a light emitting semiconductor device, which has a pumped region and an unpumped absorber region and in which an active layer has a quantum well structure and driving current/light output characteristics have dependence on the pulse width of a driving current, driven by an input signal including noise to be reduced, a light receiving device for receiving light emitted from the above light emitting semiconductor device to generate a light reception signal at a level corresponding to the amount of the received light, and level determining means for discriminating the light reception signal outputted from the above light receiving device with a threshold level corresponding to the pulse width of the noise to be reduced.

According to the present invention, an input current signal including chattering noise is injected into the above described light emitting semiconductor device, thereby to cut a noise signal due to chattering having a small pulse width. When the amount of injecting current is made constant, a light output becomes weak if the pulse width is small while being strong if it is large.

If the intensity of this light output is binarized using a predetermined threshold value in a level determining circuit, an output having noise cut is obtained. Thus, according to the present invention, a noise reducing apparatus can be realized by a semiconductor light emitting device, a light receiving device and a level determining circuit, the construction thereof being simplified.

The light beam scanner according to the present invention is characterized by comprising a light emitting semiconductor device which has a pumped region and an unpumped absorber region and in which an active layer has a quantum well structure and the central wavelength of emitted light has dependence on a driving current or dependence on driving time, a driving circuit capable of controlling the level or the driving time of the driving current supplied to the above light emitting semiconductor device, and a grating for deflecting a light beam emitted from the above light emitting semiconductor device depending on its wavelength.

The present invention achieves scanning of the light beam by combining the above described light emitting semiconductor device with the grating utilizing the phenomenon that the central wavelength of emitted light is greatly changed in the vicinity of a critical point for laser oscillation by changing the level or the pulse width of the driving current. Consequently, no mechanical moving parts are required, thereby to make it possible to realize scanning of the light beam by only electrical control.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a graph showing the Al composition in the vicinity of the active layer;

FIGS. 4a, 4b and 4c and 5a, 5b, 5c and 5d are waveform diagrams showing a driving current pulse and an emitted light output pulse of the edge emitting semiconductor device;

FIG. 6 is a diagram typically showing the light output pulse of the edge emitting semiconductor device;

FIGS. 7a, 7b and 7c are graphs respectively showing emission spectra at points A, B and C shown in FIG. 6;

FIG. 8 is a graph showing driving current/light output characteristics of the edge emitting semiconductor device;

FIGS. 9a, 9b, 9c and 9d are graphs respectively showing emission spectra at points D, E, F and G shown in FIG. 8.

FIG. 10 is a block diagram showing the construction of a logic unit;

DESCRIPTION OF THE PREFERRED EMBODIMENTS

Figure 1:
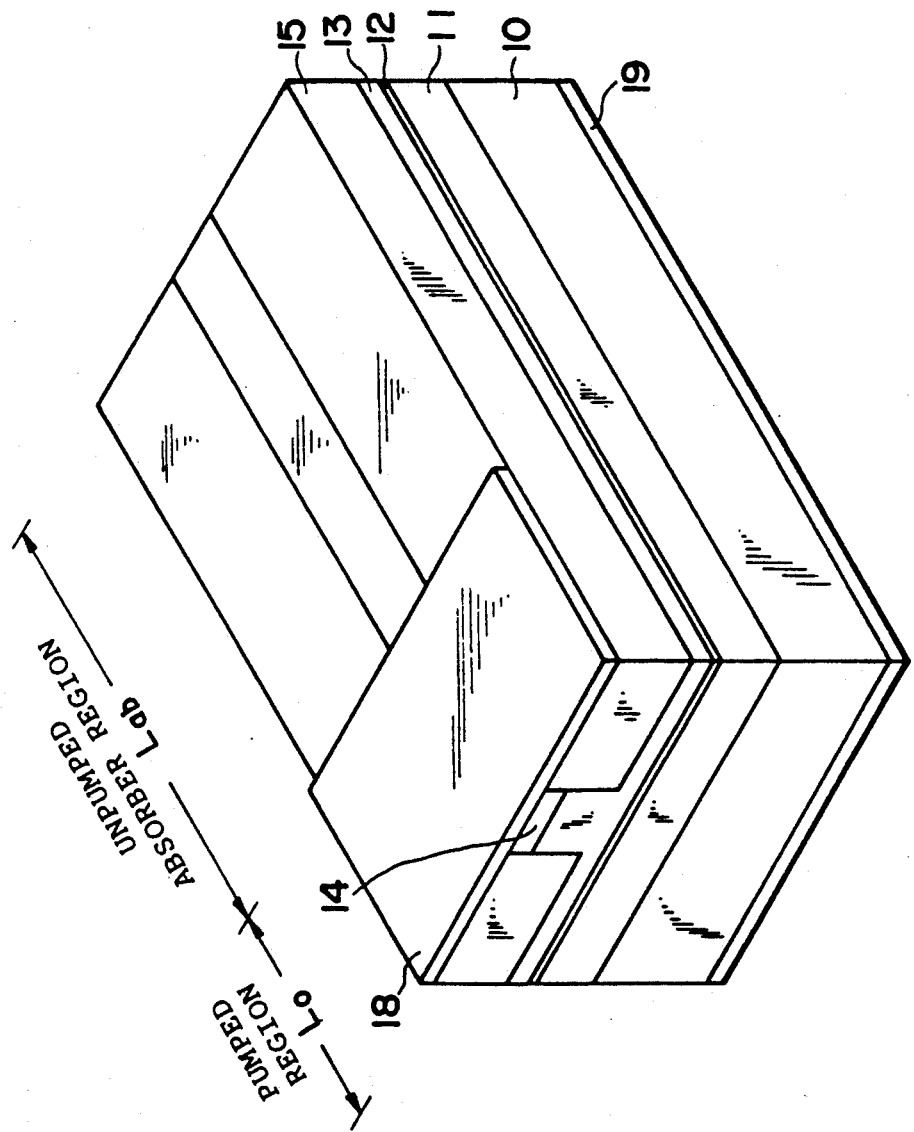
FIG. 1 is a perspective view showing the construction of a ridge waveguide type edge emitting semiconductor device in which an active layer has a quantum well structure and which has an unpumped region.

FIG. 1 illustrates the construction of a ridge waveguide type edge emitting semiconductor device used in the present invention, which has a pumped region or a current injection region and a non-pumped region or current non-injection region (unpumped absorber region or section) and in which an active layer has a quantum well structure.

In FIG. 1, an n-type AlGsAs cladding layer 11, a GRIN-SCH-MQW (Graded Index-Separate Confinement Heterostructure-Multi Quantum Well) active layer 12, a p-type AlGaAs cladding layer 13 and a p+-type GaAs cap layer 14 are sequentially grown on an n-type GaAs substrate 10. The p-type AlGaAs cladding layer 13 and the p+-type GaAs cap layer 14 are etched to the vicinity of the middle of the depth of the p-type AlGaAs cladding layer 13 on both their sides so as to form a long narrow ridge portion in their central part. Portions removed by this etching are provided with a buried layer 15 formed of heat resistant polyimide resin having electrical insulating characteristics. An n-side electrode 19 having a double structure formed of an AuGeNi alloy/Au and a p-side electrode 18 having a double structure formed of CR/Au are respectively provided on the entire lower surface and only a part of the upper surface of this light emitting semiconductor device. The p-side electrode 18 is provided on the side of a light emitting edge. A portion where this p-side electrode 18 is provided is a pumped region, and a portion where the p-side electrode 18 is not provided is an unpumped absorber region. An example of the Al composition in the vicinity of the active layer 12 and the thickness of each layer is shown in FIG. 2.

When a driving (exciting) current is caused to flow between both the electrodes 18 and 19, the current locally flows in the ridge portion, particularly the ridge portion of the pumped region because the buried layer 15 exists on both sides of the ridge portion, thereby to cause light emission (non-laser emission and laser emission) having properties as described below.

The active layer should have a quantum well structure. It may have a single quantum well structure. As materials of the buried layer, high-resistive semiconductor materials (for example, amorphous silicon) may be used in addition to polyimide resin. In addition, p-type and n-type materials may be reversed. Furthermore, semiconductor materials other than an AlGaAs mixed crystal can be used.

It has been found that such a ridge waveguide type edge emitting semiconductor device has the following properties.

(1) Driving current/emitted light output characteristics have dependence on the pulse width of a driving current.

Figure 3A:
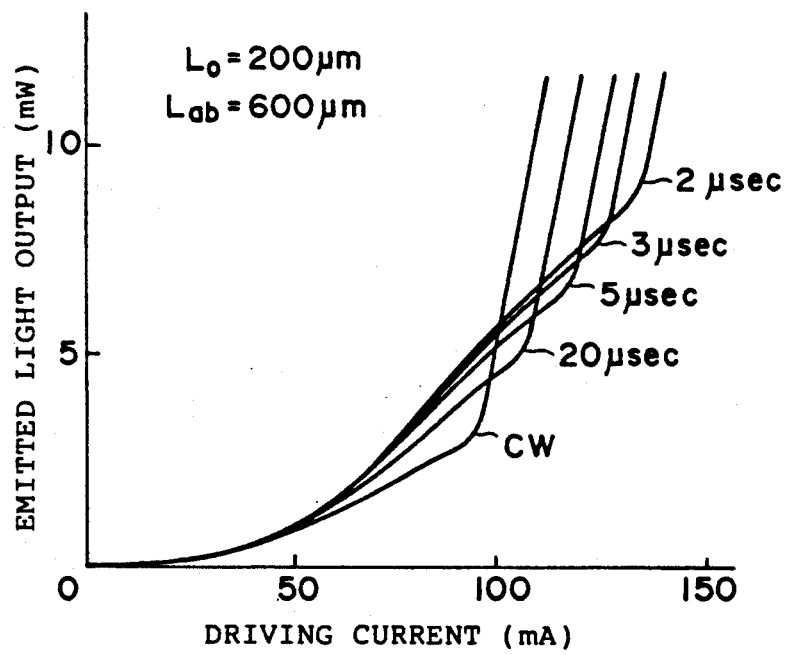
FIGS. 3a, 3b and 3c are graphs showing driving current light output characteristics of the edge emitting semiconductor device.
Figure 3B:
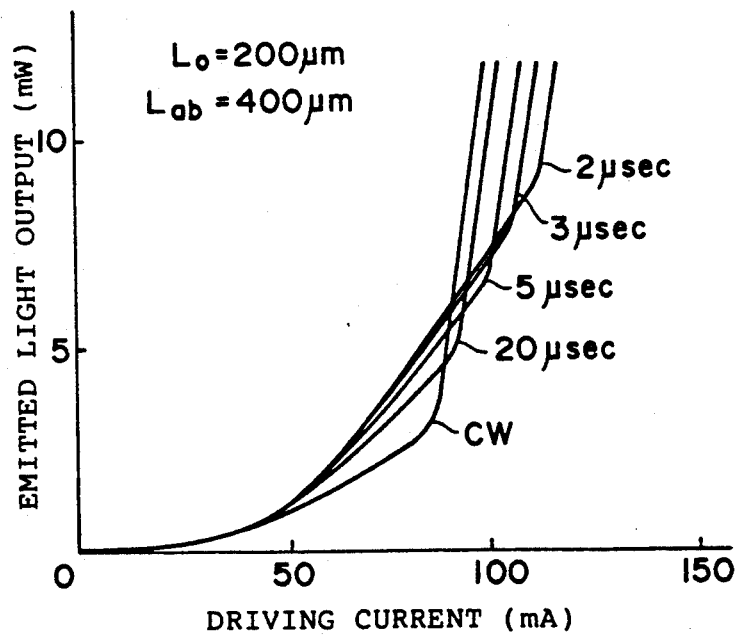
Figure 3C:
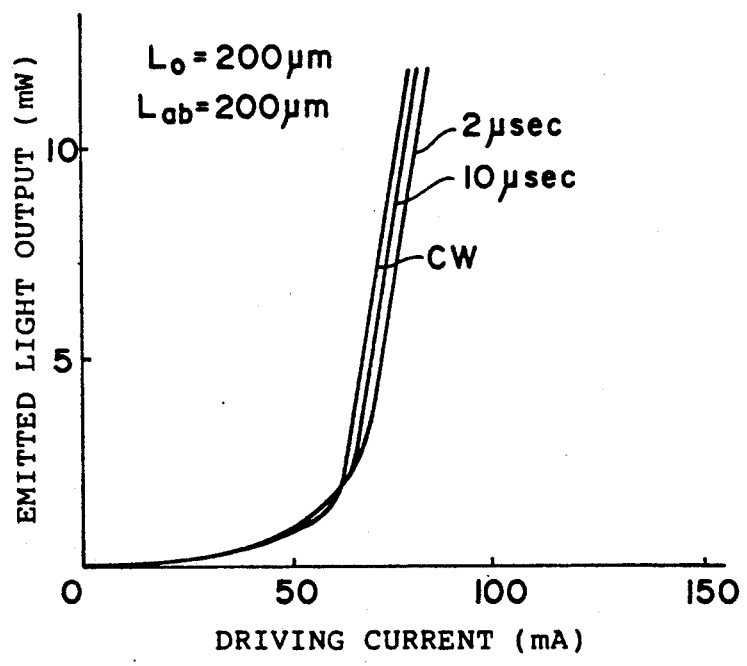

FIGS. 3a to 3c show driving current/emitted light output characteristics in driving the above described light emitting semiconductor device by a square-wave current. 2, 3, 5, 10 and 20 μsec denote the pulse widths (parameters) of the square-wave driving current, and CW represents a waveform in the case of continuous driving (Continuous Wave). FIG. 3a shows a case where the length $L_{ab}$ of an unpumped absorber region is 600 μm, FIG. 3b shows a case where $L_{ab}$ is 400 μm, and FIG. 3c shows a case where $L_{ab}$ is 200 μm. In any case, the length $L_0$ of a pumped region is 200 μm.

From the graphs, a threshold current for laser oscillation and a light output at the threshold current for laser oscillation tend to be decreased if the pulse width of the driving current is increased. The larger the length $L_{ab}$ of the unpumped region is, the more significant such a tendency is. More specifically, when the driving current having a constant value is caused to flow, the longer the pulse width of the driving current is, the larger the light output is.

(2) The central wavelength of emitted light has dependence on driving time and dependence on a driving current.

FIGS. 4a to 4c show waveforms of a driving current pulse and an emitted light output pulse, where $L_0=200$ μm, $L_{ab}=600$ μm, and the driving current I is 125 mA. FIG. 4a shows a case where the pulse width of the driving current is 2 μsec, FIG. 4b shows a case where it is 3 μsec, and FIG. 4c shows a case where it is 5 μsec. If the pulse width of the driving current is 3 μsec or more, such time response is exhibited that the emitted light output pulse first falls and rises halfway with respect to the driving current having a constant value. If the pulse width is large, the rise of the emitted light output pulse becomes abrupt.

FIGS. 5a to 5d also show waveforms of a driving current pulse and an emitted light output pulse, where $L_0=200$ μm, $L_{ab}=600$ μm, and the pulse width of the driving current is made constant, i.e. 2 μsec. FIG. 5a shows a case where I=100 mA, FIG. 5b shows a case where I=120 mA, FIG. 5c shows a case where I=130 mA, and FIG. 5d shows a case where I=140 mA. The drawings show that the rise of the emitted light output pulse is shifted to the left and becomes abrupt if the driving current is increased.

FIG. 6 typically shows the waveform of the emitted light output pulse, where the initial time point of the light output is a point A, the time point where the light output is decreased is a point B, and the time point where the light output subsequently rises is a point C.

FIGS. 7a, 7b and 7c show emission spectra at the above described points A, B and C, respectively. At the points A and B, the intensity has its peak on a point where the wavelength λ of emitted light is in the vicinity of 750 nm. At the point C, on the other hand, the central wavelength λ of emitted light is shifted to the side of a longer wavelength by approximately 20 nm, and the intensity has its peak at the vicinity of 770 nm. Non-laser emission occurs at the points A and B, while laser emission occurs at the point C. Thus, it has been found that the centeral wavelength of emitted light is greatly shifted (jumped) depending on the duration of driving (pulse width) even if the driving current having a constant value is caused to flow.

FIG. 8 shows an example of the driving current/light output characteristics shown in FIGS. 3a to 3c, points D, E, F and G being put on this characteristic curve.

FIGS. 9a, 9b, 9c and 9d show emission spectra at the points D, E, F, and G. At the points D, E and F, the intensity has its peak on a point where the wavelength of emitted light is in the vicinity of 750 nm. At the point G where laser emission occurs, on the other hand, the central wavelength of emitted light is similarly shifted to the vicinity of 770 nm.

Thus, the above described light emitting semiconductor device is characterized in that the central wavelength of emitted light is greatly shifted depending on the driving time and the driving current.

The logic unit according to the present invention utilizes the fact that the driving current/emitted light output characteristics in the above described light emitting semiconductor device has dependence on the pulse width of the driving current.

Figure 11:
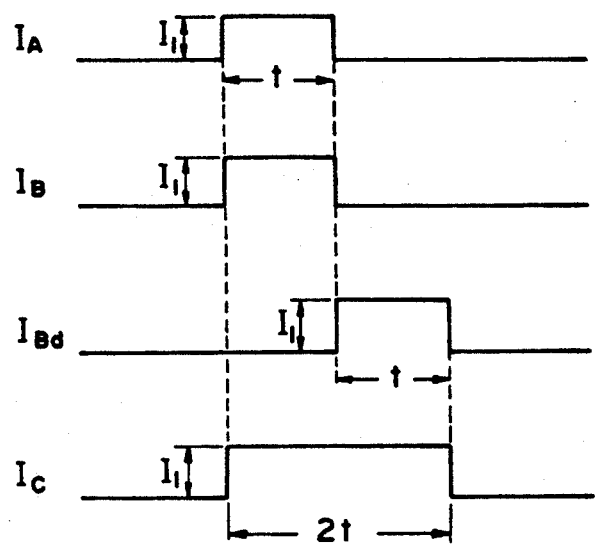
FIG. 11 is a waveform diagram showing input and output signals of each block shown in FIG. 10.
Figure 12:
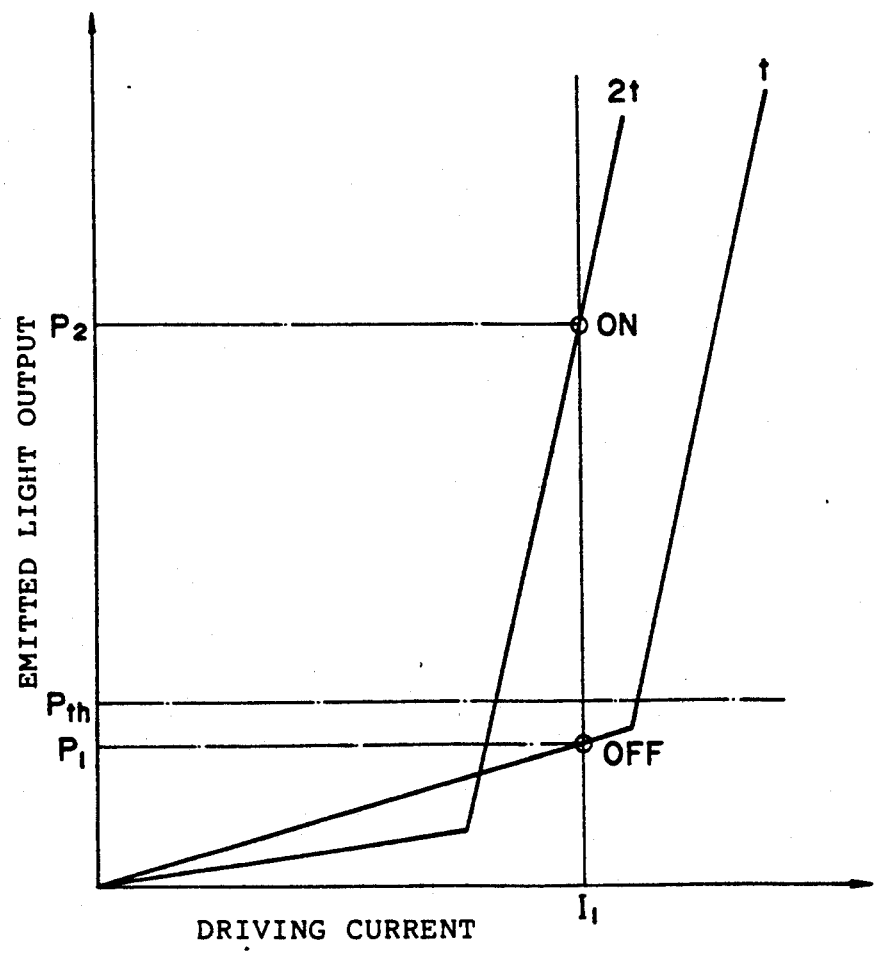
FIG. 12 is a graph showing driving current/emitted light output characteristics for explaining an operation of the logic unit.

FIGS. 10 and 11 respectively show a specific example of the construction of the logic unit and input and output signals thereof. FIG. 12 typically shows driving current/emitted light output characteristics in the above described light emitting semiconductor device for convenience of illustration.

In FIG. 12, a light output of the light emitting semiconductor device is $P_1$ when the value of a pulse driving current is $I_1$ and the pulse width thereof is t. When the value of the driving current is maintained at $I_1$ and the pulse width thereof is doubled, i.e., 2t, the light output takes a very large value as represented by $P_2$. An AND logic operation can be executed utilizing this property.

Referring to FIGS. 10 and 11, two input electric signals $S_A$ and $S_B$ are respectively applied to pulse generating circuits 21 and 22. The signals $S_A$ and $S_B$ assume a logical value 1 (at a high level or on level) or 0 (at a low level or off level). The pulse generating circuits 21 and 22 are triggered on the leading edge of the input signals, respectively, to generate single pulse current signals $I_A$ and $I_B$ each having a pulse width of t, which are constituted by, for example, monostable multivibrators (one-shot circuits). The currents $I_A$ and $I_B$ take an equal current value $I_1$. The current $I_B$ outputted from the pulse generating circuit 22 is delayed by time corresponding to the pulse width t by a delay circuit 23, to be a current $I_{Bd}$ (the current value thereof is also I1). The currents IA and $I_{Bd}$ are added by an adding circuit 24, thereby to obtain a current $I_C$ taking a current value of $I_1$ and having a pulse width of 2t. The light emitting semiconductor device 20 shown in FIG. 1 is driven by this current $I_C$.

An emitted light output of the light emitting semiconductor device 20 is received by a light receiving device (for example, a photo-diode) 25, to output a light reception signal at a level corresponding to the emitted light output. This light reception signal is applied to a level determining circuit 26. The level determining circuit 26 has a threshold value corresponding to a level $P_{th}$ between the above described emitted light outputs $P_1$ and $P_2$ and discriminates the level of the light reception signal inputted with this threshold value to generate a logical output 1 of 0.

Therefore, only if both the input signals $S_A$ and $S_B$ are 1, the pulse width of the current $I_c$ becomes 2t, so that the emitted light output of the light emitting semiconductor device 20 becomes $P_2$. Accordingly, the logical output of 1 is obtained from the level determining circuit 26. If at least one of the input signals $S_A$ and $S_B$ is 0, the pulse width of the current $I_c$ is t or 0, so that the emitted light output of the light emitting semiconductor device 20 becomes $P_1$ or 0. Accordingly, the logical output of 0 is obtained from the level determining circuit 26. In the above described manner, an AND logical output of the input signals $S_A$ and $S_B$ is generated from the level determining circuit 26.

If input signals are of three types or more, an AND logic operation is executed in the same manner. In the case of three inputs, there are provided two delay circuits for respectively delaying the input signals by t and 2t. The threshold value of the level determining circuit 26 is set to be intermediate between an emitted light output generated when a driving current having a pulse width of 2t is applied and an emitted light output generated when a driving current having a pulse width of 3t is applied.

It will be described that the logic unit shown in FIG. 10 can perform OR and EXOR (exclusive logical sum) operations in addition to the AND operation depending on how the threshold value of the level determining circuit 26 is set.

Figure 13:
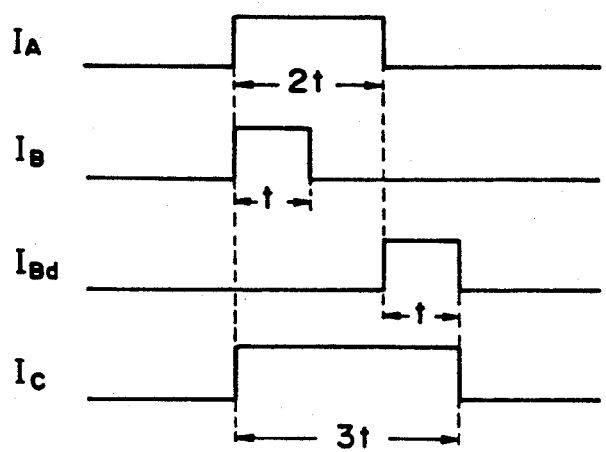
FIGS. 13 and 14 are a waveform diagram and a graph for developing the explanation, which respectively correspond to FIGS. 11 and 12.
Figure 14:
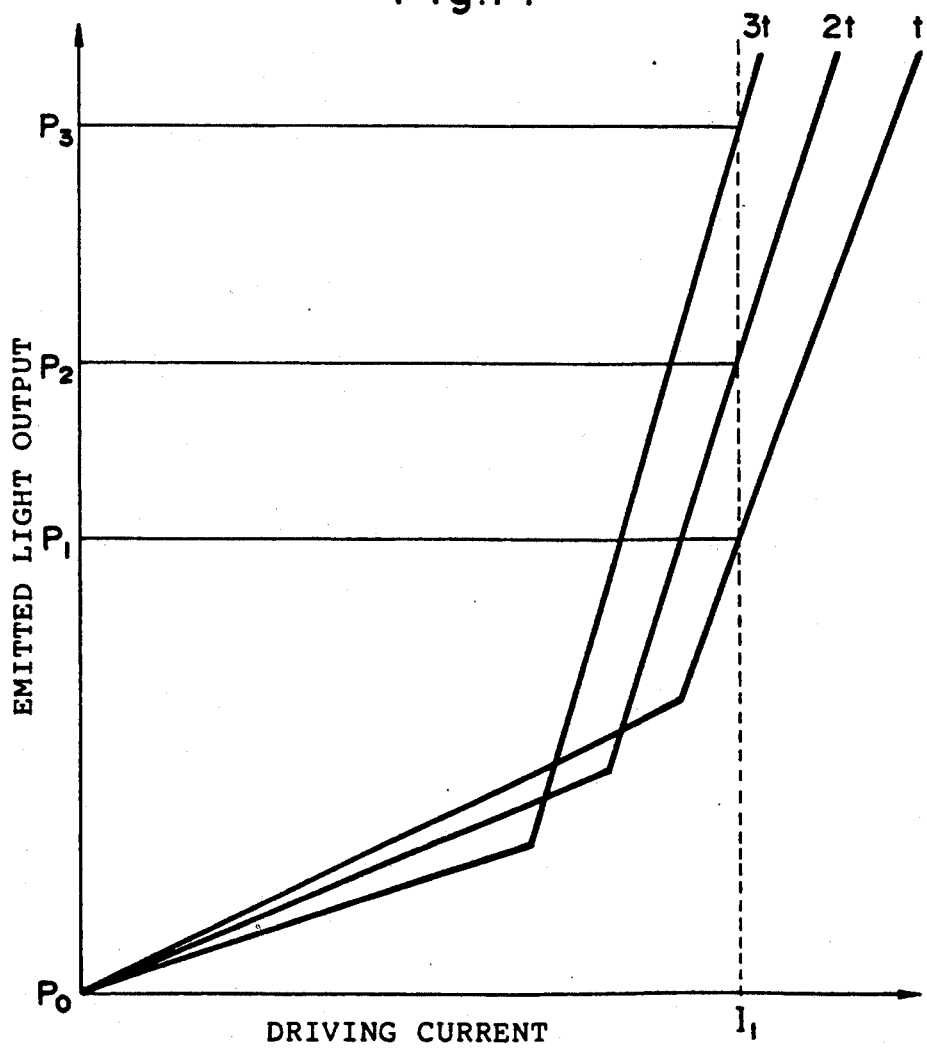

As shown in FIG. 14, let $P_1$, $P_2$ and $P_3$ be emitted light outputs of the light emitting semiconductor device 20 which is driven by driving currents having pulse widths of t, 2t and 3t (the current values thereof are all $I_1$), respectively, and let $P_0$ be a level at which light is not emitted. In addition, as shown in FIG. 13, it is assumed that the pulse generating circuits 21 and 22 respectively generate pulses having pulse widths of 2t and t. Let 2t be the delay time in the delay circuit 23. Accordingly, the pulse width of the current $I_C$ obtained by addition becomes 3t.

In the above described manner, the relation between the logical values of the signal $S_A$ and $S_B$ and the emitted light output of the light emitting device 20 is shown in the following table.

| logical value of input signal | | emitted light output |
| --- | --- | --- |
| $S_A$ | $S_B$ | |
| 1 | 1 | $P_3$ |
| 1 | 0 | $P_2$ |
| 0 | 1 | $P_1$ |
| 0 | 0 | $P_0$ |

Therefore, the AND logic operation is executed assuming that the threshold value $P_{th}$ of the level determining circuit 26 satisfies the condition $P_3 > P_{th} > P_2$ and a logic output of 1 is generated when the emitted light output P satisfies the condition $P > P_{th}$, while the OR logic operation is executed assuming that $P_1 > P_{th} > P_0$ and the logic output of 1 is generated when $P > P_{th}$. In addition, the EXOR operation can be executed if the level determining circuit 26 has two threshold values $P_{th1}$ and $P_{th2}$, $P_1 > P_{th1} > P_0$ and $P_3 > P_{th2} > P_2$, and a logic output of 1 is generated when $P_{th2} > P > P_{th1}$.

Although in the above described example, the pulse widths of the output pulses of the circuits 21 and 22 are made different from each other for easy understanding, the circuit 21 and 22 may generate input pulses having the same pulse width, in which case the AND, OR and EXOR operations can be executed in exactly the same manner.

The noise reducing or cancelling apparatus according to the present invention utilizes the fact that driving current/emitted light output characteristics in the above described light emitting semiconductor device has dependence on the pulse width of a driving current.

Figure 15:
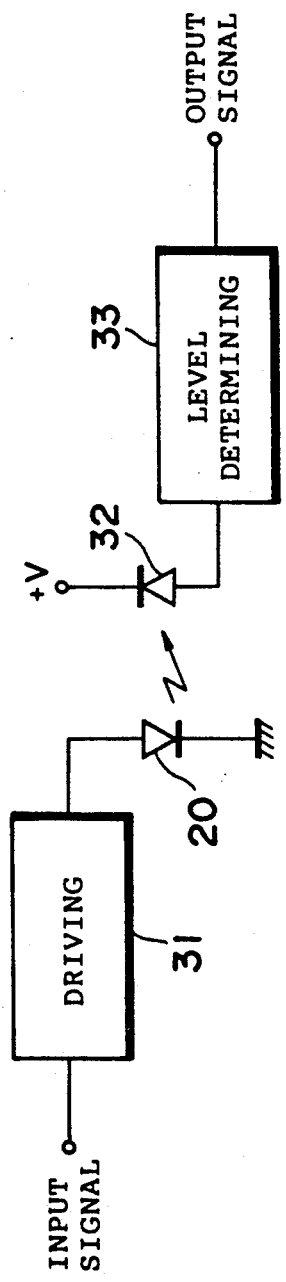
FIG. 15 is a block diagram showing the construction of a noise reducing apparatus.
Figure 16:
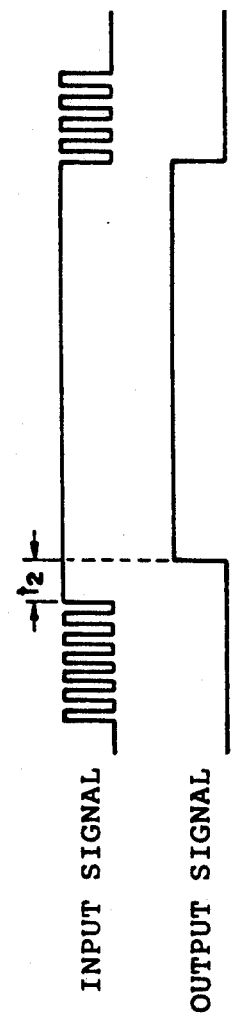
FIG. 16 is a waveform diagram showing input and output signals of each block shown in FIG. 15.
Figure 17:
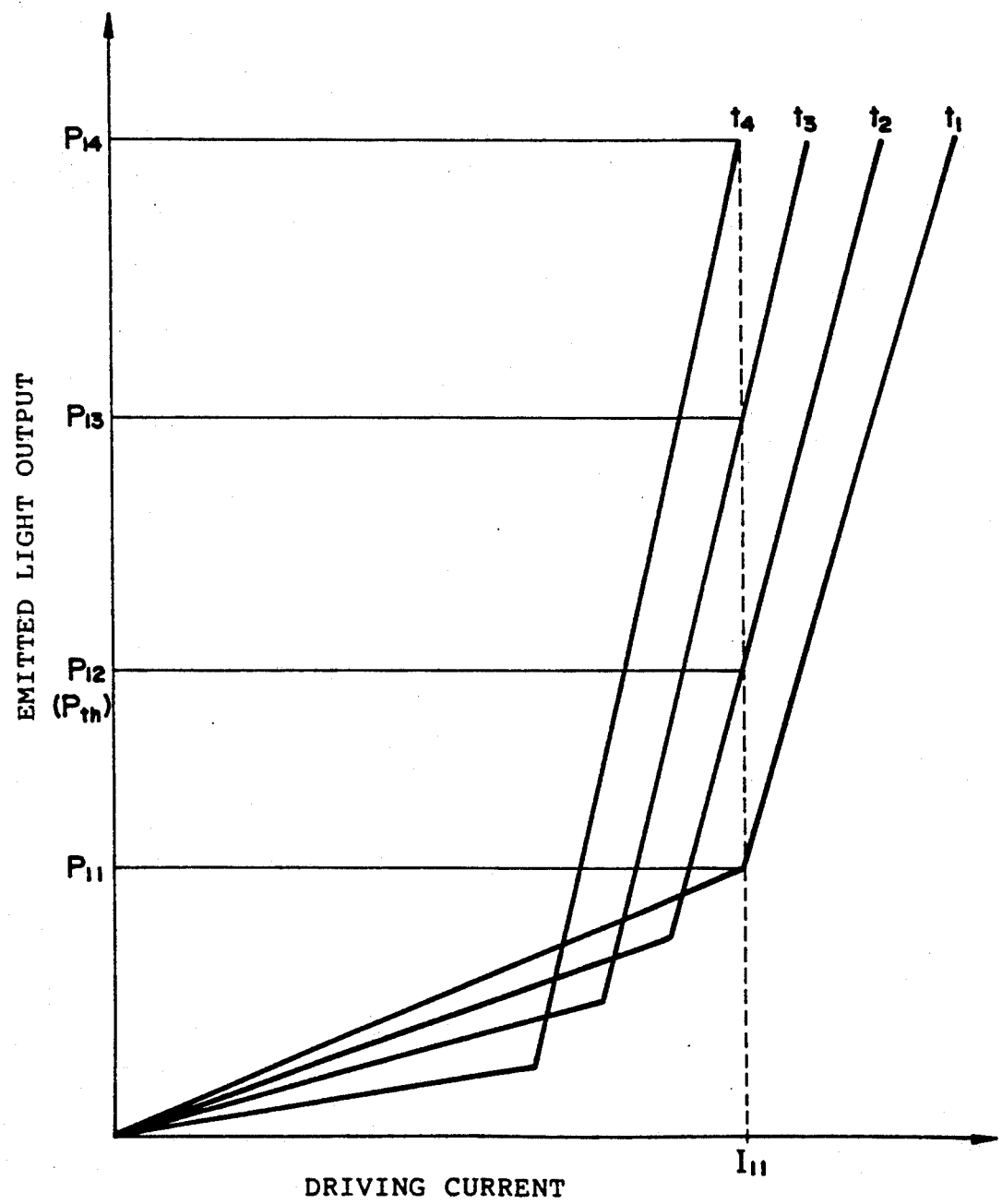
FIG. 17 is a graph showing driving current/emitted light output characteristics for explaining an operation of the noise reducing apparatus.

FIGS. 15 and 16 respectively show a specific example of the construction of the noise reducing apparatus and input and output signals thereof. FIG. 17 typically shows the driving current/emitted light output characteristics in the above described light emitting semiconductor device for convenience of illustration.

In FIG. 17, if the value of a pulse driving current is $I_{11}$ and the pulse width thereof is $t_1$, a light output of the light emitting semiconductor device is $P_{11}$. If the value of the driving current is maintained at $I_{11}$ and the pulse width thereof is set to $t_2$ which is larger than $t_1$, the light output assumes a value as represented by $P_{12}$ which is larger than $P_{11}$. If the pulse width of the driving current becomes larger ($t_4 > t_3 > t_2 > t_1$) with the value $I_{11}$ of the driving current being kept constant, a corresponding light output is increased ($P_{14} > P_{13} > P_{12} > P_{11}$).

Referring to FIGS. 15 and 16, the light emitting semiconductor device 20 shown in FIG. 1 is driven by an input signal through a driving circuit 31. An emitted light output of the light emitting semiconductor device 20 is received by a light receiving device (for example, a photodiode) 32, to output a light reception signal at a level corresponding to the emitted light output. This light reception signal is applied to a level determining circuit 33. The level determining circuit 33 has a threshold value $P_{th}$ and determines the level of the light reception signal inputted at this threshold value to generate an output signal.

If the threshold value $P_{th}$ of the level determining circuit 33 is brought into a level corresponding to the above described emitted light output $P_{12}$, an emitted light output based on an input signal (noise component) having a pulse width of $t_2$ or less does not pass through the level determining circuit 33. More specifically, the apparatus shown in FIG. 15 serves as a filter in the case of the noise component having a pulse width of $t_2$ or less. The pulse width of a noise component to be reduced in an input signal can be changed by changing the threshold value $P_{th}$ of the level determining circuit 33.

Figure 18:
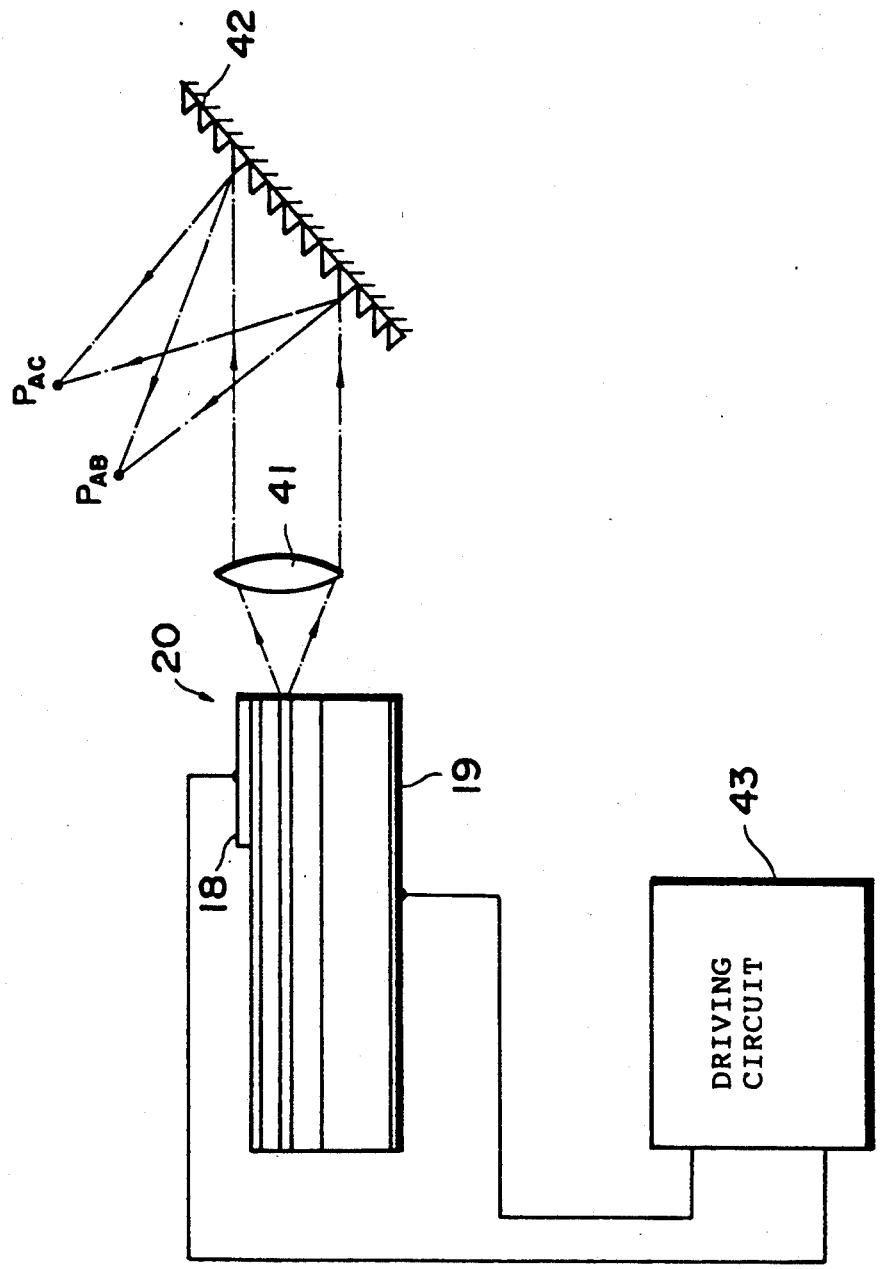
FIG. 18 is a diagram showing the construction of a light beam scanner.

The light beam scanner according to the present invention positionally switches a light beam spot utilizing the phenomenon that the central wavelength of emitted light is greatly shifted (by approximately 20 nm) by the laser oscillation in the light emitting semiconductor device shown in FIG. 1 changing the driving time (the pulse width of a driving current) or changing the value of the driving current. An example of the construction thereof is shown in FIG. 18.

The light emitted from the above described light emitting semiconductor device 20 is collimated by a lens 41, to be incident on a grating (diffraction grating) 42. The grating 42 is used for deflecting the incident light depending on its wavelength (there are two types of gratings: a reflection type and a transmission type). A driving circuit 43 of the light emitting semiconductor device 20 can change the pulse width or the value of the driving current.

If the pulse width of the driving current supplied to the light emitting semiconductor device 20 from the driving circuit 43 is nearly from the point A to the point B shown in FIG. 6, the central wavelength of emitted light of the light emitting semiconductor device 20 is around 750 nm. Accordingly, a beam spot formed by the grating 42 is in a positon represented by $P_{AB}$. If the pulse width of the driving current is increased to be from the point A to the point C shown in FIG. 6, the light emitting semiconductor device 20 is set into laser oscillation so that its central wavelength becomes approximately 770 nm. Accordingly, the beam spot is moved to a position represented by $P_{AC}$. Thus, a light beam can be scanned (the position of the beam spot can be jumped or shifted) by changing the pulse width of the driving current.

As described with reference to FIGS. 8 and 9, the central wavelength of emitted light of the light emitting semiconductor device can be also changed by changing the value of the driving current with the pulse width thereof being constant, thereby to make it possible to realize scanning of the light beam in the same manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A noise reducing or canceling apparatus comprising:
   a light emitting semiconductor device, which has a pumped region and an unpumped absorber region and in which an active layer has a quantum well structure and driving current/light output characteristics have dependence on the pulse width of a driving current, driven by an input signal including noise to be reduced;
   a light receiving device for receiving light emitted from said light emitting semiconductor device to generate a light reception signal at a level corresponding to the amount of the received light; and
   level determining means for determining the light reception signal outputted from said light receiving device at a threshold level corresponding to the pulse width of the noise to be reduced.

2. A light beam scanner comprising:
   a light emitting semiconductor device which has a pumped region and an unpumped absorber region and in which an active layer has a quantum well structure and the central wavelength of emitted light has dependence on a driving current or dependence on driving time;
   a driving circuit capable of controlling the level or the driving time of the driving current supplied to said light emitting semiconductor device, and
   a grating for deflecting a light beam emitted from said light emitting semiconductor device depending on its wavelength.

* * * * *